SUPERCONDUCTIVE ELECTRICAL DEVICE

Filed Sept. 6, 1960

FREDERICK W. SCHMIDLIN
INVENTOR.

BY Fraser and Bogucki

ATTORNEYS

United States Patent Office 3,245,055
Patented Apr. 5, 1966

3,245,055

SUPERCONDUCTIVE ELECTRICAL DEVICE

Frederick W. Schmidlin, Redondo Beach, Calif., assignor to The Bunker Ramo Corporation, Stamford, Conn., a corporation of Delaware Filed Sept. 6, 1960, Ser. No. 53,998
12 Claims. (Cl. 340—173.1)

This invention relates to superconductive electrical devices and more particularly to such a device for effecting a control of a plurality of separate electrical circuits.

In the investigation of the electrical properties of materials at very low temperatures, it has been found that a plot of the electrical resistivity of certain materials experiences a discontinuity as the temperature of the material approaches absolute zero (0° Kelvin). In fact, for the materials of interest to the instant invention, the electrical resistivity becomes equal to zero below some critical temperature. Such materials have come to be known as superconductors, and the temperature at which the discontinuity in the resistivity curve occurs is known as the transition temperature.

Recent developments have made it relatively simple to maintain electrical circuits including superconductive materials below the transition temperatures thereof so that the practical application of superconductive devices in electrical circuits becomes feasible. The peculiar property of superconductors, namely, that the resistance is zero in the superconducting region, makes it possible for individual superconductive devices to be interconnected to perform logical functions in data processing systems and digital computers. Furthermore, since the devices may be fabricated of material layers of the order of a few hundred angstroms in thickness, it can be seen that an individual device may be of very small size. In addition, since the device is operated principally in its region of superconductivity, current flowing therein when the element is superconducting dissipates no power. Accordingly superconductive devices become extremely attractive for use in a complex system, such as a digital computer.

It has been found that the transition point, that is, the point at which a given material changes between superconducting and normally resistive states, is a function of both temperature and applied magnetic field. Another way to look at the situation is to consider that the transition temperature changes as the applied magnetic field is varied. With a magnetic field applied, the temperature at which superconductivity begins for a given material is lowered, and furthermore this temperature decreases as the intensity of the magnetic field is increased. Therefore it can be seen that a superconductive material may be switched in and out of its superconducting region by maintaining its temperature slightly below its zero magnetic field transition temperature and by varying the applied magnetic field above and below some threshold value applicable for that temperature. This phenomenon suggests that the presence of a current existing in a superconductor may be detected by the application of a particular magnetic field above the threshold value for the temperature at which the superconductor is maintained in order that current flowing therein may produce a voltage drop that can be observed.

It should be noted that the flow of electric current within a superconductor itself generates a magnetic field which, when combined with any externally applied magnetic field, determines whether the threshold field value is exceeded. It will be appreciated that the magnetic field arising from the flow of current in one superconductor may be applied to a second superconductor to exceed the threshold field value thereof and thereby cause the second superconductor to switch from its superconductive region to its region of normal electrical resistance. An arrangement for sensing the existence of a persistent current in a superconductor loop in the manner just described is disclosed in a copending United States patent application, Serial No. 709,414, now abandoned, filed January 16, 1958, and entitled "Superconductive Memory Device."

In the cited patent application, a device is disclosed in which a persistent current may be induced in a superconductive circuit loop by an element inductively coupled thereto which is connected to a writing signal source. After the persistent current is established, the writing signal source is disconnected, and a reading circuit is connected in its place for ascertaining the presence of the persistent current in the superconductive circuit loop by detecting the effect of the magnetic field produced by the persistent current. Advantageous arrangements are described whereby not only the magnitude but the direction of the persistent current may be readily ascertained. In each of the described arrangements, however, the same element is used for reading and for writing the stored persistent current, and only one external circuit is subject to control by the superconductive loop.

It is a general object of the invention to provide an improved structure utilizing superconductors in an electrical circuit.

It is a further object of the invention to provide a new and improved logical circuit utilizing superconductive structures.

It is another object of the invention to provide superconductive structures suitable for controlling a relatively large number of electrical circuits.

It is still another object of the invention to provide a superconductive device which controls a number of separate electrical circuits in response to a signal applied to a single circuit.

It is a still further object of the invention to provide a superconductive structure affording control of a single circuit from any one or more of a number of associated individual circuits.

Briefly, an accordance with the invention, a structure is provided which utilizes inductive coupling for establishing a persistent current in a closed superconductive loop and employs the effect of an associated magnetic field on an adjacent superconductor to provide an indication of the presence of the persistent current. In this structure, separate conductor members are individually arranged to both control the persistent current (the writing function) and to respond to the presence of a persistent current (the reading or gating function).

In one specific embodiment of the invention, a writing element extends along only a short segment of the closed loop superconductor. Other separate conductor members are situated along the closed loop for serving as sensing devices or gates to provide more versatile and extensive control of external circuits. In another specific embodiment of the invention, a single superconductor member serving as a gating element is associated with a plurality of closed loop superconductors so that a number of controls may be associated with an individual gate.

A more complete understanding of the invention may be gained from a reading of the following detailed description taken in conjunction with the drawing, in which.

At temperatures near absolute zero (0° Kelvin) some materials lose all measurable resistance to the flow of electrical current and become for practical purposes perfect conductors. A list of a few of these materials and the corresponding transition temperature at which the materials change from a normally resistive state to a superconductive state is given below:

| | Deg. K. |
|---|---|
| Niobium | 8 |
| Lead | 7.2 |
| Vanadium | 5.1 |
| Tantalium | 4.4 |
| Mercury | 4.1 |
| Tin | 3.7 |
| Indium | 3.3 |
| Thallium | 2.4 |
| Aluminum | 1.2 |
| Titanium | 0.5 |

In addition to the materials listed above, other elements as well as many alloys and compounds have been found to exhibit superconductive properties at temperatures ranging between 0° and 17° Kelvin. For a more complete discussion of the subject, reference is made to a book entitled "Superconductivity" by D. Schoenberg, Cambridge University Press, Cambridge, England (1952). The above-listed transition temperatures apply only where the materials are in a substantially zero magnetic field. In the presence of a magnetic field, the transition temperature is decreased so that a given material may be in an electrically resistive state even for temperatures below the specified transition temperature at which the material would be superconductive in the absence of a magnetic field.

Inasmuch as a magnetic field may arise from a current flowing in a superconducting material itself, the material may be considered to have a critical or threshold value of electrical current as well as a threshold value of magnetic field which will cause it to switch from a condition of superconductivity to an electrically resistive condition. Accordingly, when a material is held at a temperature below its normal transition temperature for a zero magnetic field, the superconductive condition of the material may be extinguished by the application of a magnetic field which may originate from an external source or may be internally generated through the flow of current in the material itself.

Figure 1:
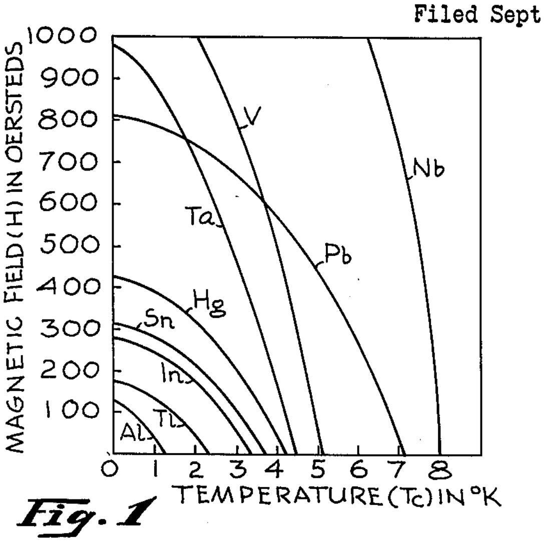
FIGURE 1 is a graph showing the effect of an applied magnetic field upon the transition temperature of a number of superconducting materials.

FIG. 1 illustrates the variation in transition temperatures ($T_c$) for several materials as a function of an applied magnetic field. In the absence of a magnetic field, the point at which each of the curves intersects the abscissa is the transition temperature at which the corresponding material becomes superconducting, measured in degrees Kelvin. For values of temperature and magnetic field falling beneath each of the several curves, the particular material is superconducting, while for values of temperature and magnetic field falling above the curve the material exhibits electrical resistance.

Figure 2:
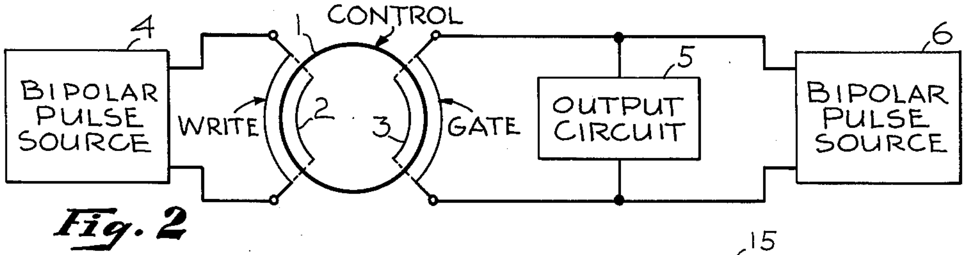
FIG. 2 is a diagrammatic illustration of one specific embodiment of the invention including separate writing and gating elements associated with a single superconductor loop.

FIG. 2 depicts one specific embodiment of the invention connected in a typical utilization circuit in which a control element 1 is associated with two separate elements 2 and 3 for establishing and sensing the existence of a persistent current in the element 1. The writing element 2 is connected to a bipolar pulse source 4 capable of producing pulses of either polarity at a desired amplitude. The gating or read-out element 3 is shown connected to an output circuit 5 and a bipolar pulse source 6. The output circuit 5 produces an indication of the voltage which may exist across the terminals of the gating element 3 when the gating element 3 is resistive and a pulse is applied from the bipolar pulse source 6.

The elements 1, 2, and 3 are of a superconducting material and are maintained in the region of superconductivity below their transition temperature. In accordance with the invention, the element 2 is positioned adjacent the element 1 along a particular portion thereof in order to establish inductive coupling between the two so that current in the writing element 2 may induce a current in the control loop 1. The gating element 3 is connected to a bipolar pulse source 6 simiiar to the pulse source 4 and also to an output circuit 5. Thus a pulse of a particular polarity from the pulse source 4, when applied to the writing element 2, induces a current in the control element 1 which may be maintained as a persistent circulating current of a specified magnitude and direction related to the applied writing pulse until changed by other pulses applied to the writing element 2.

In accordance with a particular aspect of the invention, the gating element 3 is associated with the control loop 1 along a particular portion thereof so that a magnetic field due to the persistent current in the control loop 1 may be applied at the gating element 3 in order to affect the superconductive properties thereof. It should be noted that this is not necessarily the same as the inductive coupling provided between the elements 1 and 2. It is a sufficient condition for the operation of this invention that a magnetic field generated by the control element 1 be present at the element 3 without necessity for magnetic flux linkages or inductive coupling between the two elements 1 and 3. In accordance with one aspect of the invention, the element 3 is of a different superconductive material than the element 1 and has a lower value of threshold magnetic field in order that it may be rendered normally resistive by the field of the persistent current in the element 1 while the latter remains superconducting.

The presence or absence of a persistent current in the control loop 1 may be detected by applying a pulse from the pulse source 6. Current flowing in a given direction in the control loop 1 applies a magnetic field transverse to the gating element 3 and in a direction related to the direction of the current in the loop. A pulse of a particular polarity from the pulse source 6 produces current in the element 3 in a direction which also develops a transverse magnetic field at the element 3. In accordance with the invention, if the combination of the two fields so produced exceeds the threshold value for the element 3, it switches out of the superconductivity region and becomes electrically resistive so that current therein produces a voltage drop across its terminals which may be detected by the output circuit 5. If, on the other hand, there is no persistent current in the control loop 1, the application of a read-out pulse from the bipolar pulse source 6 does not develop a sufficinet magnetic field to drive the element 3 from its superconductive region to its resistive region, and current through the element 3 does not produce any voltage drop between its terminals.

Operation of the invention in the manner just described indicates how it may be employed as a binary storage element or unipolar output control device. It will be clear that the writing selected pulses of alternative polarities from the bipolar pulse source 4 and by applying a bipolar pulse of first one polarity and then the other from the pulse source 6, the device may be used as a ternary storage element or for controlling circuitry which is responsive to pulses of alternative polarities.

Thus the application of a bipolar pulse from the source 6 causes an output pulse of one polarity or the other at the output circuit 5 depending upon the direction of the persistent current in the control loop 1. As before, if the persistent current is zero, no output pulse is generated.

The writing current pulses must be larger than those applied to a device in which the writing element and the control loop are of approximately equal length, such as the device disclosed in the above-identified patent application, by the approximate factor $l_c/l_{wc}$, where $l_c$ is the circumferential length of the control circuit and $l_{wc}$ is the length of the writing circuit segment juxtaposed with the control. This is because the mutual inductance between the writing circuit and the control is reduced by the factor $l_{wc}/l_c$.

In the arrangement of the instant invention, the writing current tends to produce a magnetic field at the control loop, principally near the ends of the writing element. This magnetic field reduces the value of the critical control current. This can be easily remedied, should it become a problem, by making those segments of the control loop where the magnetic field produced by the writing circuit is maximum of a superconductive material having a high transition temperature, such as lead. In addition, the writing element itself may advantageously be of a material having a high transition temperature in order that it remain superconducting throughout the operation of the device.

Figure 3:
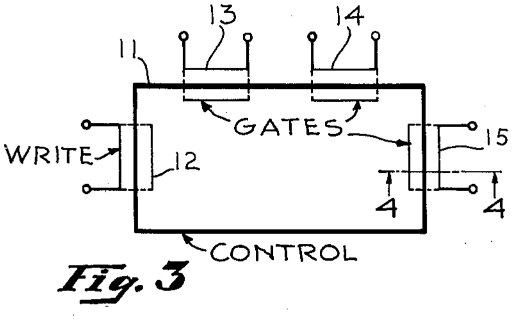
FIG. 3 is a diagrammatic illustration of another specific embodiment of the invention in which a single control loop is associated with a plurality of gate circuits and a separate writing circuit.

By providing a control loop having an increased length relative to the length of the associated gate and writing elements, additional gates may be included. Moreover, the control loop may be made rectangular or any other convenient shape suitable for conducting a persistent circulating current. FIG. 3 illustrates one possible arrangement including a single writing segment and three associated gates. It should be noted that, as discussed above, by making the control loop longer with respect to the writing segment, the magnitude of the writing pulse must be increased proportionately. In FIG. 3 a control loop 11 is represented as a rectangular superconductive loop having a writing element 12 and gating elements 13, 14, and 15 associated therewith. Such an arrangement may be connected in a circuit similar to that shown in FIG. 2 with the provision of separate output circuits and read-out pulse sources for the individual gates 13, 14, and 15. Operation of this device will then be as described with respect to the arrangement of FIG. 2.

Figures 4A, 4B, 4C, 4D:
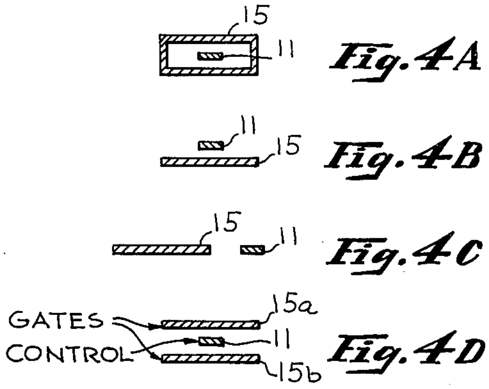
FIGS. 4A, 4B, 4C and 4D are cross-sectional illustrations of a portion of the embodiment of FIG. 3 taken at the line 4—4 and showing various suitable configurations of a structure in accordance with the invention.

FIGS. 4A, 4B, 4C, and 4D represent possible alternative cross-sectional configurations which may be employed in the arrangement of FIG. 3. In each of these configurations it is contemplated that the respective superconducting elements may be built up of extremely thin layers of suitable superconducting materials to provide a device which is very small and compact. In FIG. 4A an arrangement is shown in which a gate 15 has been built up around a control loop 11 by depositing the selected portions thereof in succeeding layers together with suitable insulation, such as silicon monoxide, between the two elements. In FIG. 4B the control loop 11 is shown as one layer deposited over a separate layer of the gating element 15, while in FIG. 4C the control loop 11 and the gate 15 are shown deposited side by side. FIG. 4D depicts an arrangement whereby a pair of gating elements may be arranged on opposite sides of the control loop 11 and along the same section thereof. In this arrangement, allowance must be made for possible interaction between the two gates 15*a* and 15*b* in addition to the desired control of the gating elements by the control loop.

As has already been discussed with reference to the graphical illustration of FIG. 1, the switching of the superconducting material from its superconducting region to its normal resistivity region at a constant temperature may be accomplished by increasing the applied magnetic field. In the embodiments of the instant invention, the applied magnetic field is produced by the flow of electrical current. In the case of a gating element, such as the gate 15 of FIG. 3, a magnetic field is produced by a persistent current in the control loop 11 as well as by a current which is applied to the gate 15 to provide the desired output, as described for the circuit of FIG. 2. Because the magnetic field is produced by both these currents, the effective field at the gate 15 may be considered in terms of an effective current, $i_{eff}$, which takes into account the effect of both control and gate currents.

If a persistent current $i_2$ is stored in the control loop 11 of FIG. 3 at the time when a gating pulse current $i_1$ arrives at the gating element 15, the effective field at 15 is (in terms of an effective gate current):

$$i_{1_{eff}}=g_1\left(i_2-\frac{M_{12}}{L_2}i_1\right)+i_1 \qquad (1)$$

where $M_{12}$ is the mutual inductance between the control loop 11 and the gating element 15, $L_2$ is the self-inductance of the control loop 11, and $g_1$ is defined as the gain of the gating element 15, namely:

$$g=\frac{\text{the critical gate current with zero control current}}{\text{the control current required to make the gate resistive with zero gate current}}$$

If gating current pulses arrive at a number of gates, such as 13, 14, and 15, simultaneously, then $$i_{1_{eff}}=g_1\left(i_2-\sum_{j=1,\,3\,\ldots\,n}\frac{M_{j2}}{L_2}i_j\right)+i_1 \qquad (2)$$

This expression determines the limit for the number of gates which can receive simultaneous pulses for the gate to operate properly. Gate 15 will switch when $i_{1_{eff}}$ exceeds the critical value of $i_1$, which is that current corresponding to a threshold value of the magnetic field which switches the material of the gate 15 from a superconductive condition to a resistive condition at a constant temperature. The sign convention in Equation 2 is such that positive gate currents produce a magnetic field which combines additively with the magnetic field at the gate due to the persistent current $i_2$ in the control loop 11. In many applications, complementary gates will be used, in which case the terms in the summation of Equation 2 will tend to a zero average, thus simplifying the expression.

As is represented in FIG. 4D, a plurality of gates may be placed in proximity to the same segment of the control loop 11 in order to provide an alternative arrangement for multiple gating in accordance with an aspect of the invention. However, in such an arrangement, a new problem of gate-to-gate interaction must be met. By carefully arranging the configuration of the gates, the magnetic field at one gate due to a current in the other can be made much less effective than the self-field of a gate current. For example, by placing the gates on opposite sides of the control loop 11, as shown in FIG. 4D, there are obtained both a geometrical factor due to the separation of the gates and the shielding effect due to the superconducting control loop, which serve to attenuate the gate-to-gate interaction. This shielding effect, known in the art, results from the fact that, until a critical magnetic field is exceeded, a magnetic field is prevented from penetrating a superconductor, and it induces circulating currents on the surface of the superconductor which, in effect, cancel the original field.

For gates in close proximity, as shown in FIG. 4D, the analysis given above must be modified to include the gate-to-gate interaction. It is appropriate here to define a gate-to-gate interaction constant $k_{ij}$ which is analogous to the $g_1$ above. The two subscripts are necessary to take into consideration the gate-to-gate interaction. Therefore:

$$k_{ij}=\frac{\text{the critical current in gate } i \text{ with all othor currents} = 0}{\text{the current in gate } j \text{ which makes gate } i \text{ resistive with all other currents} = 0}$$

Where there is gate-to-gate interaction, we may define the effective current (corresponding to an effective magnetic field) as:

$$i_{1_{eff}}=i_1+g_1\left(i_2-\sum_{j=1,3\ldots n}\frac{M_{j2}}{L_2}i_j\right)+\sum_{j=3\ldots n}k_{ij}i_j \quad (3)$$

The respective values of $k_{ij}$ are best determined empirically with the complete control loop assembled. Even for gates in fairly close proximity, however, $k_{ij}$ should be small compared to unity. Here again, in complementary gating applications, the currents, $i_j$, alternate in sign so that the interactions tend to average out. The limiting criterion for permissible values of $k_{ij}$ and $M_{j2}$ is determined by the following condition:

$$i_1+g_1\left(i_2-\sum_{j=1,3\ldots n}\frac{M_{j2}}{L_2}i_j\right)+\sum_{j=3\ldots n}k_{ij}i_j>i_{1\,crit.}>$$
$$i_1+g_1\left(-i_2-\sum_{j=1,3\ldots n}\frac{M_{j2}}{L_2}i_j\right)+\sum_{j=3\ldots n}k_{ij}i_j \quad (4)$$

Stating this in words, if the persistent control current is in one direction, the gates must switch when the gates are pulsed, but not if the persistent control current is in the opposite direction.

Figures 5, 6:
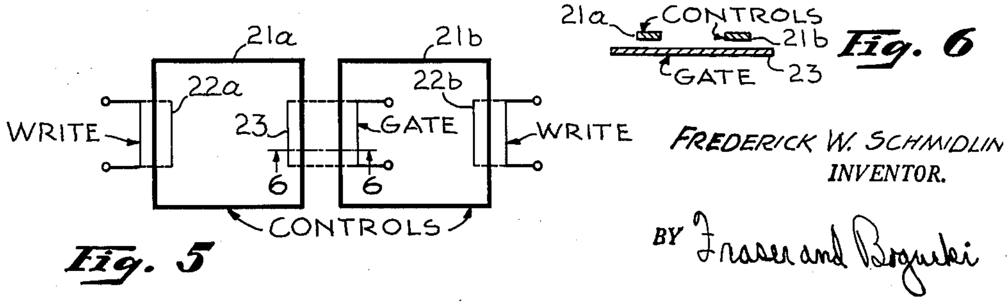
FIG. 5 is a diagrammatic illustration of still another specific embodiment of the invention in which a plurality of control loops are associated with a single gating element.
FIG. 6 is a sectional view of a portion of the embodiment of FIG. 5 taken at the line 6—6.

Just as a number of gates can be operated by a single control loop, a number of control loops can be employed in conjunction with a single gate element. One such arrangement is represented in FIG. 5, in which separate control loops 21*a* and 21*b*, each having a writing element 22*a* or 22*b*, respectively, associated therewith, are juxtaposed along a single gating element 23. This arrangement may be connected in a circuit similar to that depicted in FIG. 2 in order to provide operation of a device in a manner similar to that already described with respect to other embodiments of the invention. FIG. 6 depicts one preferred arrangement in a cross-sectional view taken along line 6—6 of FIG. 5. In FIG. 6, the control segments 21*a* and 21*b* are shown as thin layers above the gate section layer 23 and electrically isolated therefrom.

In a multiple control arrangement, such as is depicted in FIG. 5, a problem arises from control-to-control interaction. In such a case care must be taken to select critical control currents, stored persistent currents, and mutual inductances of proper value between the respective pairs of controls so that a variation of a persistent control current in one control loop, such as 21*a*, does not induce a sufficient change in the magnitude of the persistent control current in an accompanying control, such as 21*b*, to drive that current above the critical value for the element and thus switch it to its region of normal resistivity. Specifically, the total current $i_1$ in a control element such as 21*a* must satisfy the following relation:

$$i_1=i_s-\frac{M_{13}}{L_1}i_3-\frac{M_{12}}{L_1}\Delta i_2>i_{1c} \quad (5)$$

where $i_{1s}$ is the stored persistent current in control 21*a*, $i_{1c}$ is the critical current for the control loop 21*a*, $i_3$ is the gating current in the gate 23, $\Delta i_2$ is any change in the control current in the control loop 21*b*, $M_{12}$ is the mutual inductance between the control loops 21*a* and 21*b*, $M_{13}$ is the mutual inductance between the control loop 21*a* and the gating element 23, and $L_1$ is the self-inductance of the control loop 21*a*. The change in the control current, $\Delta i_2$, can be represented as:

$$\Delta i_2=\sum_{j=1,3\ldots n}\frac{M_{2j}}{L_2}i_j \quad (6)$$

for any number $n$ of control loops associated with a single gating element. It will be noted that in Equation 5, which specifies the current in control loop 21*a*, the effect of the writing current in the element 22*a* (FIG. 5) is ignored, since the writing current is deliberately introduced to change the persistent control current of the control loop 21*a*.

In the preferred structural arrangements depicted in FIGS. 4A, 4B, 4C, 4D, and 6 for providing the respective embodiments of the instant invention, it is contemplated that the control and gate elements may be constructed by evaporating superconducting films which are electrically separated by a thin film of an insulator, such as silicon monoxide. The gate element advantageously comprises a superconductive material having a lower transition temperature than that of the control element. In one particular embodiment the material of the control element may be tin, while the material of the gating element may be indium.

Various specific arrangements of the instant invention having specific structural relationships for satisfying particular requirements, such as, for example, fast switching, high current gain, power gain, or high sensitivity, may be employed within the scope of this invention. It has been established experimentally that evaporated films having a thickness from 3 to $8\times10^{-5}$ centimeters can be made to switch between regions of superconductivity and normal resistivity in about $20\times10^{-9}$ seconds under expected operating current. It is therefore expected that film thicknesses of the order of $10^{-4}$ centimeters will have suitably fast transition speeds where switching time is of paramount importance. The film thickness should be maintained at a minimum. Furthermore, to attain high switching speed and to permit operation at a low current level, the respective elements should be kept small (of the order of $10^{-2}$ centimeters in width and a fraction of a centimeter in length). To achieve maximum power gain, the resistance of the gate should be kept as large as possible. Since the thickness of the film is limited, it becomes desirable to employ a gating material having as high a resistivity as possible. Many suitable gating materials therefore may be found among alloys in preference to a pure superconducting element.

Figure 7:
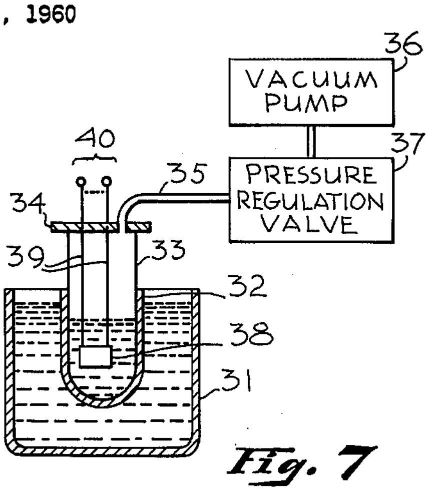
FIG. 7 is a diagrammatic representation of one suitable apparatus which may be employed for maintaining structures in accordance with the invention at a proper temperature of operation.

FIG. 7 is a diagrammatic illustration of an arrangement for maintaining the circuits of the present invention at a suitable low temperature near absolute zero. In FIG. 7 there is shown an exterior insulated container 31 which is adapted to hold a coolant, such as liquid nitrogen. Within the container 31 an inner insulated container 32 is suspended for holding a coolant, such as liquid helium, which maintains the circuits of the invention at the proper operating temperature. The top of the container 32 may be sealed by a sleeve 33 and lid 34 through which a conduit 35 connects the inner chamber 32 with a vacuum pump 36 and a pressure regulation valve 37. The pump 36 functions to lower the atmosphereic pressure within the chamber so as to control the temperature of the helium. The pressure regulation valve 37 functions to regulate the pressure within the chamber so that the temperature is held constant. One or more circuits 38 of the invention may be suspended in the liquid helium at the proper operating temperature in which the circuit components are superconducting. Connection to the circuits 38 is made by the lead-in wires 39, which also may be constructed of a superconducting material to minimize resistance. The lead-in wires 39 extend through the lid 34 to the terminal set 40.

Although the condition of the material while superconducting has been described herein as being a condition of zero resistance, it will be appreciated that a small amount of resistance may be present in the superconducting condition of the material without necessarily affecting the operation of the circuit as described.

By means of the invention, an electrical circuit is provided of a relatively small size, which is capable of producing an instantaneous voltage or a number of such voltages representing the storage of information. Accordingly, a large number of the circuits may be grouped together in a digital computer, data processing system, or the like, to provide a small volume, high capacity memory system having the advantage of requiring a substantially zero switching time to derive information from the system. So long as the circuits of the invention are maintained at the proper temperature, information may be stored indefinitely without requiring a regeneration of the information and without the dissipation of electrical power. In addition, due to the simplicity of construction of the circuits of the invention, a high degree of reliability may be achieved.

Although exemplary embodiments of the invention have been illustrated and described hereinabove, it will be understood that the invention is not limited thereto. Accordingly, the accompanying claims are intended to include all equivalent arrangements falling within the scope of the invention.

What is claimed is:

1. An electrical device comprising: a continuously electrically isolated closed loop element of a superconductive material; writing means only inductively coupled to said element for inductively establishing a persistent current therein; gating means electrically isolated from said element but positioned along a portion thereof in parallel juxtaposition within the magnetic field of said persistent current, said gating means comprising a superconductive material; and means including a bipolar pulse source electrically connected to the gating means for providing an output signal having a polarity indicative of the direction of an induced persistent current in response to a bipolar pulse from said source.

2. An electrical device comprising: a first element of a superconductive material; writing means inductively coupled to said first element for controlling a persistent current therein; gating means electrically isolated from said first element but positioned within the magnetic field of said persistent current, said gating means comprising a superconductive material; and means for controlling the transition point of said gating means so as to sense the existence of said persistent current comprising a second element of a superconductive material and additional means inductively coupled to said second element for controlling a persistent current therein.

3. An electrical device in accordance with claim 2 wherein said first and second elements comprise individual closed loops.

4. An electrical device comprising: a first electrically isolated closed loop element of a superconductive material having a predetermined transition point; writing means only inductively coupled to said first element for inductively generating a persistent current therein; gating means electrically isolated from said first element but positioned within the magnetic field of said persistent current, said gating means comprising a plurality of gating elements of a supreconductive material different from the material of said first element; and means for selectively controlling the transition points of said gating elements in order to determine the condition of said persistent current, whereby different output signals are provided for different levels of said persistent current.

5. An electrical device in accordance with claim 4 wherein each of said writing and gating means is positioned with its longitudinal axis parallel to the longitudinal axis of a selected portion of the closed loop of said first element.

6. An electrical device comprising: first and second elements of a superconductive material arranged in individual closed loops; means individually inductively coupled to said first and second elements for controlling respective persistent currents therein; and a single gating means of a superconductive material electrically isolated from said first and second elements but positioned within both magnetic fields of said respective persistent currents in order to determine the existence of said persistent currents.

7. An electrical circuit device in accordance with claim 1 wherein said element comprises a film of a superconducting material and said gating means comprises a layer of superconducting material surrounding said film.

8. An electrical circuit device in accordance with claim 1 wherein said element and said gating means comprise distinct films of superconducting materials in adjacent relationship.

9. An electrical circuit device in accordance with claim 8 wherein said gating means comprises a plurality of parallel films of superconducting material and said element comprises a film of superconducting material positioned between a pair of adjacent films of said gating means.

10. An electrical device comprising: continuously electrically isolated closed loop of a superconductive material; writing means only inductively coupled to said closed loop in parallel relationship with a portion only thereof for inductively establishing a persistent current in said closed loop; gating means of a superconductive material electrically isolated from said closed loop positioned within the magnetic field of said persistent current, said gating means being arranged in parallel configuration with a different portion of said closed loop; and means for establishing a predetermined current in said gating means in a direction parallel to said persistent current of said closed loop for determining the condition of said persistent current, said gating means comprising a plurality of individual gate elements aligned along corresponding distinct portions of said closed loop and said predetermined current establishing means comprising means for establishing varying selected currents in different individual gate elements.

11. An electrical device comprising: a permanently electrically isolated closed loop of a superconductive material; writing means only inductively coupled to said closed loop in parallel relationship with a portion only thereof for inductively establishing a persistent current in said closed loop; gating means of a superconductive material electrically isolated from said closed loop positioned within the magnetic field of said persistent current, said gating means being arranged in parallel configuration with a different portion of said closed loop; and means for establishing a predetermined current in said gating means in a direction parallel to said persistent current of said closed loop for determining the condition of said persistent current, said gating means comprising a pair of individual gate elements coaligned along one portion of said closed loop on opposite sides thereof.

12. An electrical device comprising: a continuously electrically isolated closed loop element of superconductive material; writing means only inductively coupled to said element for inductively establishing a persistent current therein; gating means electrically isolated from said element but positioned along a portion thereof in parallel juxtaposition within the magnetic field of said persistent current, said gating means comprising a superconductive material; and means including a bipolar pulse source electrically connected to the gating means for providing an indication of the state of the persistent current in said element in response to a bipolar pulse from said source whereby an output pulse of one polarity indicates a persistent current in a first direction, an output pulse of an opposite polarity indicates a persistent current in an opposite direction, and the absence of an output pulse indicates a persistent current equal to zero.

(References on following page)

References Cited by the Examiner

UNITED STATES PATENTS

| | | | |
|---|---|---|---|
| 2,877,448 | 3/1959 | Nyberg | 340—173.1 |
| 2,888,201 | 5/1959 | Housman | 307—88.5–12 |
| 2,913,881 | 11/1959 | Garwin | 340—173.1 |
| 2,944,211 | 7/1960 | Richards | 307—88.5–12 |
| 2,949,602 | 8/1960 | Crowe | 307—88.5–12 |
| 2,962,681 | 11/1960 | Lentz | 307—88.5–12 |
| 2,980,807 | 4/1961 | Groetzinger | 340—173.1 |
| 2,989,714 | 6/1961 | Park | 338—32 |
| 3,022,468 | 2/1962 | Rosenberger | 340—173.1 |
| 3,061,738 | 10/1962 | Wilson | 340—173.1 |
| 3,065,359 | 11/1962 | MacKay | 340—173.1 |
| 3,093,748 | 6/1963 | Anderson | 340—173.1 X |
| 3,094,685 | 6/1963 | Crowe | 340—173.1 |
| 3,114,136 | 12/1963 | Smallman | 340—173.1 |
| 3,138,784 | 6/1964 | Lentz | 340—173.1 |
| 3,181,126 | 3/1965 | Green | 340—173.1 |

OTHER REFERENCES

RCA Techincal Note #221, by Glicksman et al., Jan. 5, 1959.

IRVING L. SRAGOW, *Primary Examiner.*

UNITED STATES PATENT OFFICE

CERTIFICATE OF CORRECTION

Patent No. 3,245,055 April 5, 1966

Frederick W. Schmidlin

It is certified that error appears in the above identified patent and that said Letters Patent are hereby corrected as shown below:

Column 2, line 41, "an" should read -- in --. Column 4, line 62, "sufficinet" should read -- sufficient --. Column 7, line 3, "current$^s$" should read -- currents --; line 66, after the equal sign, "$i_s$" should read -- $i_{1s}$ --. Column 8, lines 61 and 62, "atmosphereic" should read -- atmospheric --. Column 9, line 55, after "first" insert -- continuously --.

Signed and sealed this 30th day of December 1969.

(SEAL)
Attest:

Edward M. Fletcher, Jr.
Attesting Officer

WILLIAM E. SCHUYLER, JR.
Commissioner of Patents